US007978046B2

(12) United States Patent
Ohashi et al.

(10) Patent No.: US 7,978,046 B2
(45) Date of Patent: Jul. 12, 2011

(54) FUSIBLE LINK UNIT

(75) Inventors: Norihiro Ohashi, Makinohara (JP); Yusuke Matsumoto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 12/250,698

(22) Filed: Oct. 14, 2008

(65) Prior Publication Data

US 2009/0108982 A1 Apr. 30, 2009

(30) Foreign Application Priority Data

Oct. 31, 2007 (JP) ................................. 2007-283073

(51) Int. Cl.

| | |
|---|---|
| ***H01H 85/02*** | (2006.01) |
| ***H01H 85/20*** | (2006.01) |
| ***H01R 13/52*** | (2006.01) |
| ***H01R 13/68*** | (2011.01) |
| ***H01R 4/38*** | (2006.01) |
| ***H05K 7/00*** | (2006.01) |

(52) U.S. Cl. ........ 337/186; 337/187; 337/190; 337/191; 337/227; 439/766; 439/522; 439/620.26; 361/833; 361/837

(58) Field of Classification Search .................. 337/191, 337/186, 187, 190, 227; 439/620.26, 766, 439/522; 361/833, 837

See application file for complete search history.

(56) References Cited

U.S. PATENT DOCUMENTS 4,531,806 A * 7/1985 Hsieh ....................... 439/620.29
5,120,617 A 6/1992 Cameron
5,438,310 A * 8/1995 Ikari ............................. 337/208
5,643,693 A * 7/1997 Hill et al. ...................... 429/121
5,645,448 A * 7/1997 Hill .............................. 439/522
5,886,611 A * 3/1999 Schaller et al. ............... 337/189
6,010,375 A * 1/2000 Higuchi ......................... 439/763
6,398,595 B2 * 6/2002 Wakata et al. ................ 439/755
6,509,824 B2 * 1/2003 Inaba et al. ................... 337/295
6,512,443 B1 * 1/2003 Matsumura et al. .......... 337/189
6,806,421 B2 * 10/2004 Matsumura ...................... 174/50
6,828,058 B2 * 12/2004 Ohtsuka et al. ................. 429/65
6,939,167 B2 * 9/2005 Kosuge ......................... 439/522
7,176,780 B2 * 2/2007 Iwata ............................ 337/188
7,292,130 B2 * 11/2007 Taga et al. ..................... 337/159

(Continued)

FOREIGN PATENT DOCUMENTS

DE 102008045089 A1 3/2009

(Continued)

OTHER PUBLICATIONS

German Office Action dated Dec. 22, 2009.

*Primary Examiner* — Jayprakash N Gandhi
*Assistant Examiner* — Bradley H Thomas
(74) *Attorney, Agent, or Firm* — Sughrue Mion, PLLC

(57) ABSTRACT

A fusible link unit includes a fusible link main body that includes a bus bar for connecting to a battery terminal, and a battery that has a battery post for connecting to the battery terminal. The fusible link main body includes an L-shaped housing having a first face and a second face which oppose two side surfaces forming a corner portion of the battery. The bus bar is connected to a fuse portion and is extended from the first face of the housing. Abutment portions for abutting against the side surfaces of the battery are provided on the first and second faces of the housing respectively.

5 Claims, 16 Drawing Sheets

U.S. PATENT DOCUMENTS

| | | | | |
|---|---|---|---|---|
| 7,381,101 | B2 * | 6/2008 | Roset et al. | 439/754 |
| 7,663,466 | B1 * | 2/2010 | Jetton | 337/191 |
| 2001/0011939 | A1 * | 8/2001 | Inaba et al. | 337/265 |
| 2002/0163416 | A1 * | 11/2002 | Matsumura | 337/112 |
| 2003/0022536 | A1 * | 1/2003 | Saito et al. | 439/76.2 |
| 2004/0048142 | A1 * | 3/2004 | Marusak et al. | 429/61 |
| 2004/0124963 | A1 * | 7/2004 | Nakamura | 337/256 |
| 2005/0190519 | A1 * | 9/2005 | Brown et al. | 361/104 |
| 2005/0285709 | A1 * | 12/2005 | Matsumura et al. | 337/227 |
| 2009/0061291 | A1 | 3/2009 | Ohashi et al. | |
| 2009/0068894 | A1 * | 3/2009 | Ohashi et al. | 439/620.26 |

FOREIGN PATENT DOCUMENTS

| | | | |
|---|---|---|---|
| JP | 2001-054223 | A | 2/2001 |
| JP | 2002-358867 | A | 12/2002 |
| JP | 2007-087823 | A | 4/2007 |

* cited by examiner

FUSIBLE LINK UNIT

BACKGROUND

The present invention relates to a fusible link unit which is fixed to a post of a battery for a motor vehicle.

As a conventional structure for assembling a fuse box, a configuration shown in FIG. 13 is known (refer to patent document 1). According to this configuration, a fuse box 100 is connected to a battery terminal 102 by means of a terminal piece (bus bar) 14. The cross section of the terminal piece 104 is formed in a U-shape, and when the terminal piece 104 is fixed to a mounting bolt 106 by means of a nut (not shown), both side walls of the U-shaped portion serve the function of a detent for the fuse box 100 at the time of the tightening of the nut. In this configuration, however, since the fuse box 100 is supported only by the terminal piece 104, if the number of circuits becomes large, a load is liable to be applied to the terminal piece 104 and the battery terminal (not shown).

In addition, as another conventional structure for assembling a fuse box, a configuration shown in FIG. 14 is known (refer to patent document 2). According to this configuration, a projection 108 which abuts against a side surface 106 of a battery 104 is provided on a case 112 of a fuse box 110, and can be expected to exhibit a detent effect of preventing the rotation of the case 112 during the tightening of the nut when the case 112 is mounted to a battery terminal 114. However, when the nut is loosened, the case 112 rotates counterclockwise, so that there is a possibility of a corner portion of the case hitting against the adjacent side surface and causing damage thereto.

Furthermore, as still another conventional structure for assembling a fuse box, a configuration shown in FIG. 15 is known (refer to patent document 3). According to this configuration, a plurality of bolt portions 122 such as input terminals are provided uprightly on a fusible link 120, and when an L-shaped terminal 124 is connected to the bolt portion 122, rotational torque is applied, so that the load at the time of tightening is applied to a battery terminal 126.

[Patent Document 1] JP-A-2002-358867 (FIG. 4)

[Patent Document 2] JP-A-2001-54223 (FIG. 1)

[Patent Document 3] JP-A-2007-87823 (FIGS. 1 and 2)

As described above, with these conventional configurations, when the nut is tightened or loosened, a load is applied to the battery terminal and the like, or the fusible link unit collides against the side wall, so that there is a problem in that these parts can be damaged and are therefore poor in durability.

SUMMARY

Accordingly, an object of the invention is to provide a fusible link unit in which during the assembling of the fusible link unit to the buttery or removal thereof at the time of maintenance, the fusible link main body is prevented from being rotated together by the tightening or loosening of the nut, and the fusible link unit including accessory parts such as the battery terminal is prevented from becoming damaged, thereby overcoming the above-described problems.

The above-described object of the invention can be attained by the following configurations.

(1) There is provided a fusible link unit, comprising:

a battery terminal that is connected to a battery post of a battery; and a fusible link main body that includes a bus bar for connecting to the battery terminal, wherein the fusible link main body includes an L-shaped housing having a first face and a second face which oppose two side surfaces forming a corner portion of the battery;

wherein the bus bar is connected to a fuse portion and is extended from the first face of the housing; and wherein abutment portions for abutting against the side surfaces of the battery are provided on the first and second faces of the housing respectively.

Here, it is preferable that, the bus bar in the housing is connected to a wire harness which is connected to an electrical equipment circuit.

Here, it is preferable that, the abutment portions are projected in first and second directions which are respectively perpendicular to an extending direction of the buttery post.

(2) Preferably, the abutment portions abut against a plurality of the side surfaces of the battery.

(3) Preferably, the abutment portions are protruding portions which are provided so as to project toward the side surfaces of the battery.

(4) Preferably, a supporting portion for abutting against an upper surface of the battery is extended from the second face of the housing. The battery post is provided on the upper surface of the battery.

(5) Preferably, the supporting portion is a protruding portion which is provided so as to project toward the upper surface of the battery.

According to the configuration of item (1) above, since the respective faces of the L-shaped housing of the fusible link main body abut against the side surfaces of the battery, during the tightening of the nut at the time of fixing the fusible link main body to the battery post or during the loosening of the nut at the time of maintenance, the fusible link main body is reliably supported and fixed with respect to a direction in which the fusible link main body receives the rotational moment.

According to the configuration of item (2) above, since the fusible link unit is supported by a plurality of surfaces straddling a corner portion of the battery, it is possible to alleviate the rotational torque (rotational moment) in both mutually opposing directions.

According to the configuration of item (3) above, since a gap is formed between the side surface of the battery and the fusible link unit by the protruding portions (ribs), the heat radiation effect of the fusible link unit during its energization and heat generation is ensured.

According to the configuration of item (4) above, since the free end of the fusible link unit is supported by the supporting portion abutting against the upper surface of the battery, even if the self weight or tension of the wire harness connected to the fusible link unit is applied to the connecting portion between the battery terminal and the bus bar of the fusible link unit, the rocking movement of the fusible link unit is restricted, and the fusible link unit can be supported appropriately.

According to the configuration of item (5) above, since a gap is formed between the upper surface of the battery and the fusible link unit by means of the protruding portion (rib), the heat radiation effect of the fusible link unit during its energization and heat generation is ensured.

According to the invention, during the during the tightening of the nut at the time of fixing the fusible link main body to the battery post or during the loosening of the nut at the time of maintenance, the fusible link main body is prevented from being rotated together, and the fusible link unit including accessory parts such as the battery terminal is prevented from becoming damaged.

BRIEF DESCRIPTION OF THE DRAWINGS

The above objects and advantages of the present invention will become more apparent by describing in detail preferred exemplary embodiments thereof with reference to the accompanying drawings, wherein:

FIGS. 12A and 12B are diagrams illustrating a modification of the fusible link unit, in which FIG. 12A is a schematic diagram of a state in which the fusible link unit is mounted on the battery, and FIG. 12B is a schematic plan view of the housing;

DETAILED DESCRIPTION OF EXEMPLARY EMBODIMENTS

Figure 1:
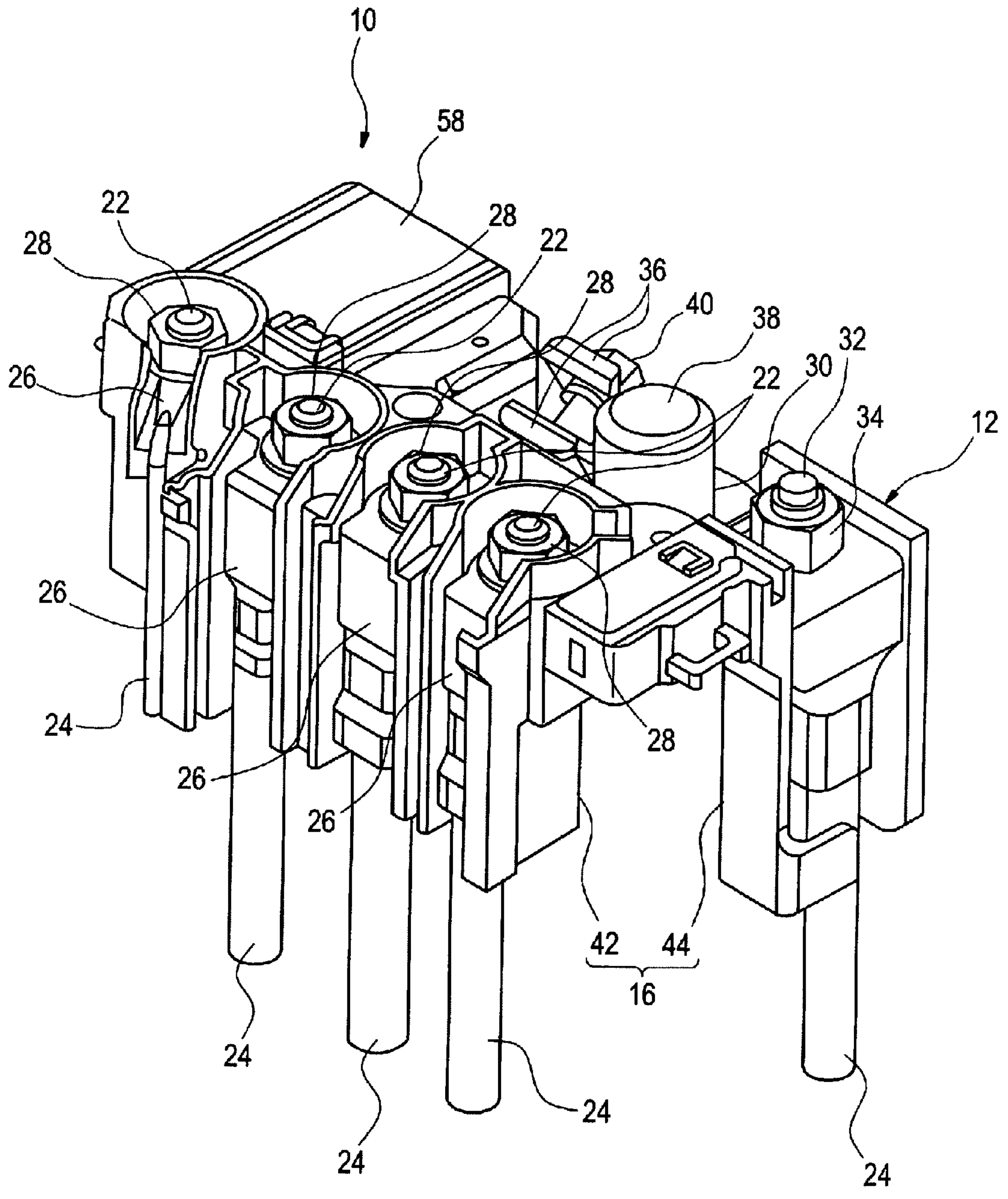
FIG. 1 is a perspective view of a fusible link unit in accordance with a first embodiment of the invention.
Figure 2:
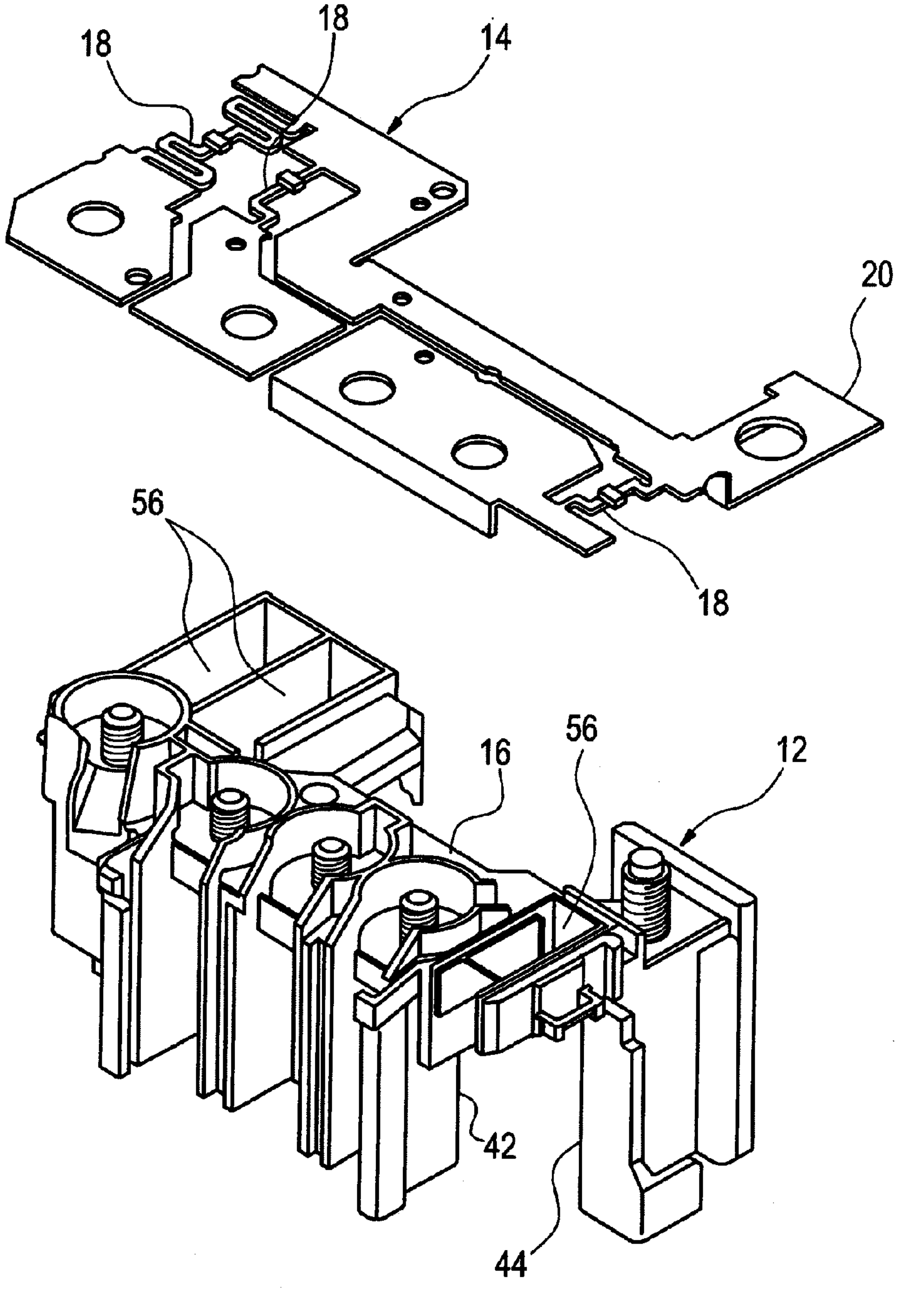
FIG. 2 is an exploded perspective view of a fusible link main body and a bus bar which make up the fusible link unit.
Figure 3:
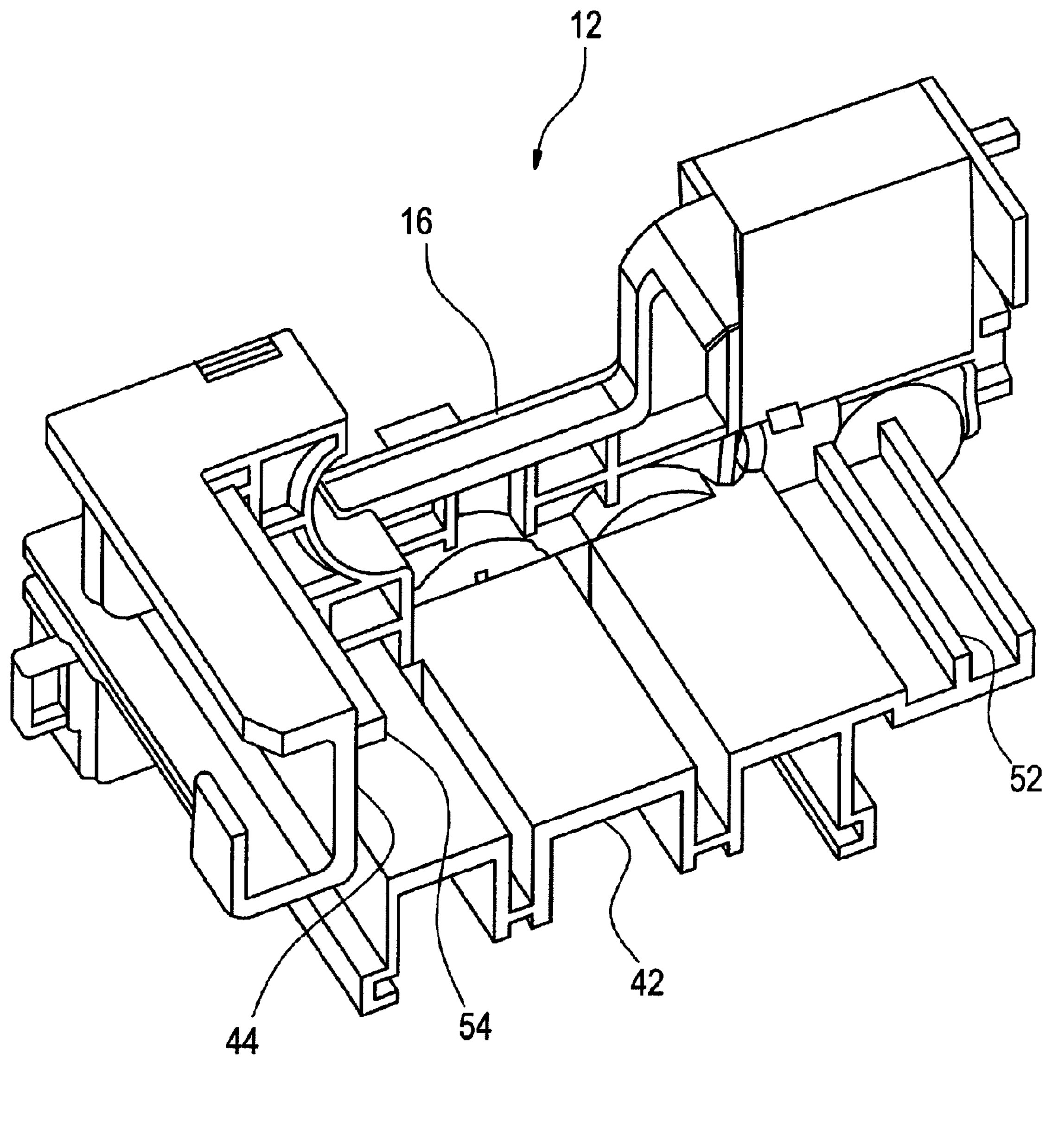
FIG. 3 is a perspective view taken from a lower side of the fusible link unit.
Figure 4:
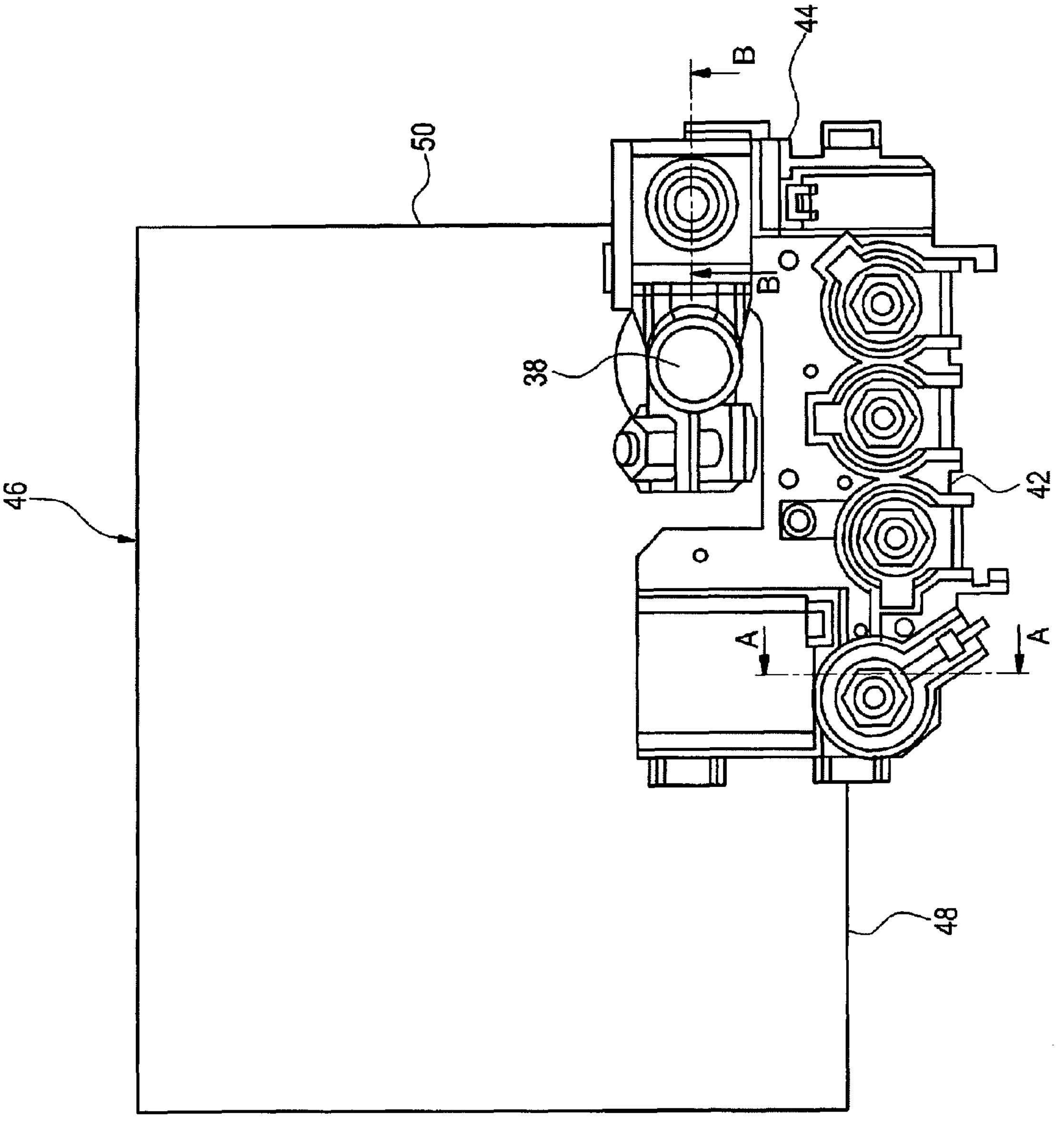
FIG. 4 is a plan view of a state in which the fusible link unit is mounted on a battery.
Figure 5:
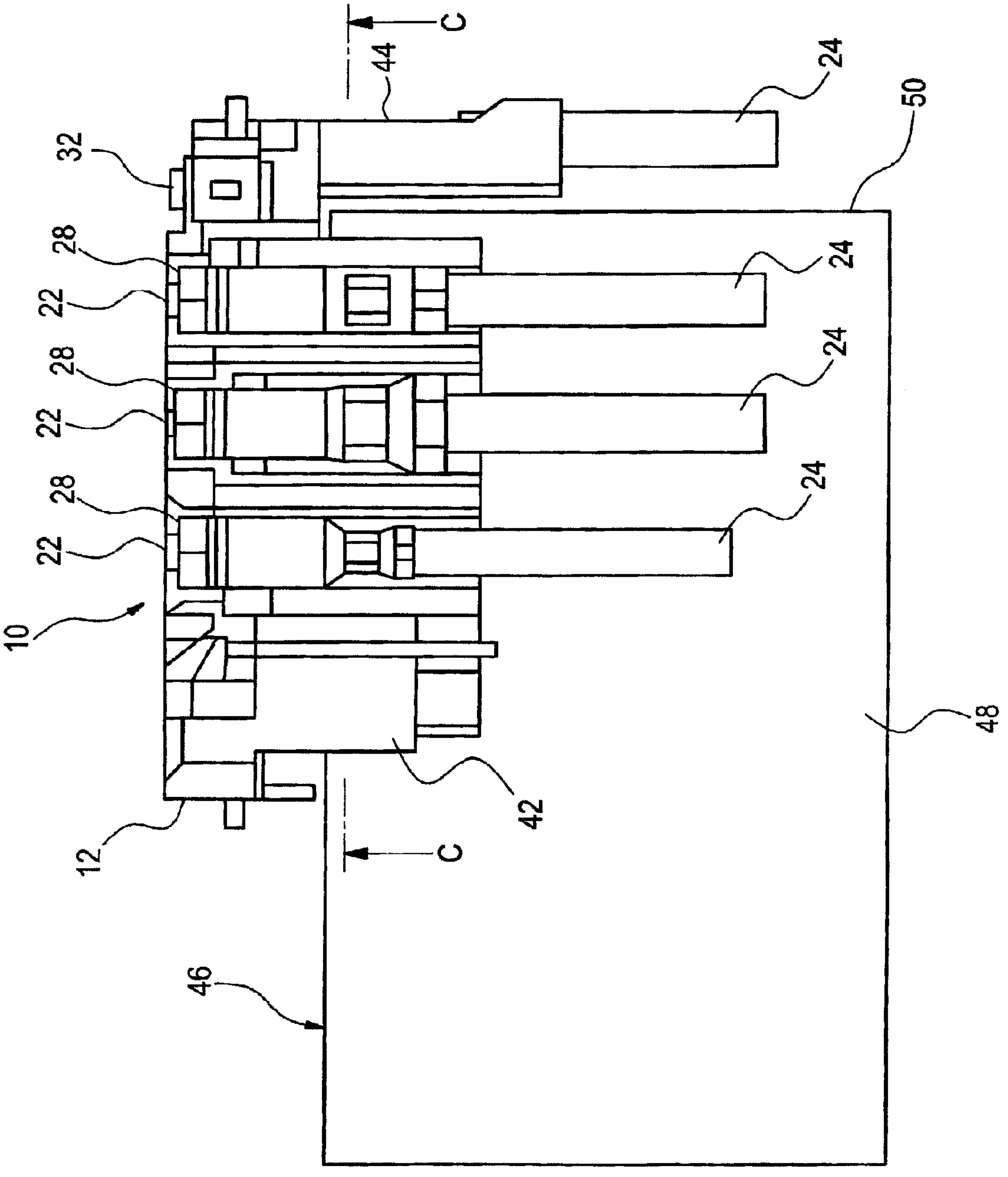
FIG. 5 is a side elevational view of the state in which the fusible link unit is mounted on the battery.

Referring now to the accompanying drawings, a description will be given of an embodiment of the invention. FIG. 1 is a perspective view of a fusible link unit in accordance with a first embodiment of the invention. FIG. 2 is an exploded perspective view of a fusible link main body and a bus bar which make up the fusible link unit. FIG. 3 is a perspective view taken from a lower side of the fusible link unit. FIGS. 4 and 5 are respectively a plan view and a side elevational view of a state in which the fusible link unit is mounted on a battery.

A fusible link unit 10 includes a fusible link main body (hereafter referred to as the main body) 12 and a bus bar 14 which is insert-molded in the main body 12. The main body 12 is made of a plastic and has an L-shaped housing 16, and the bus bar 14 having integrally molded fusible portions 18 is insert-molded therein.

A connecting end portion 20 of the bus bar 14 is provided extendingly from one side of the housing 16 in a direction toward the battery 16. In addition, four stud bolts 22 for connecting to a wire harness are fitted on the bus bar 14. A wire harness 24, which is connected to respective electrical parts, is tightened onto each stud bolt 22 by means of a connecting end portion 26 and a nut 28. In addition, a stud bolt 32 for a battery terminal 30 is fitted to the connecting end portion 20 of the bus bar 14, and the battery terminal 30 is connected to that stud bolt 32 by means of a nut 34. The battery terminal 30 has a pair of clamping pieces 36 at its end portion, and the battery terminal 30 is assembled to a battery post 38 as the clamping pieces 36 are placed on the battery post 38 and are tightened by a bolt 40.

Respective sides (faces) 42 and 44 making up an L-shape of the housing 16 are adapted to oppose two side surfaces 48 and 50 making up a corner portion of a battery 46. Further, ribs 52 and 54, which project toward the side surfaces 48 and 50 of the battery 46 and abut against the side surfaces 48 and 50 of the battery 46, are respectively provided on the respective sides 42 and 44 of the housing 16 along the vertical direction.

The main body 12 has window portions 56 for visually confirming the fusible portions 18, and these window portions 56 are closed by a cover 58 which is fitted on top of the main body 12.

According to the fusible link unit 10 having the above-described configuration, the electric current which flows from the battery 46 passes through the bus bar 14 having the fusible portions 18 and is supplied to a downstream circuit. In the event that an abnormal current has been generated, the fusible portion or portions 18 melt down, thereby preventing the smoke generation from the wire harness 24.

Figure 6:
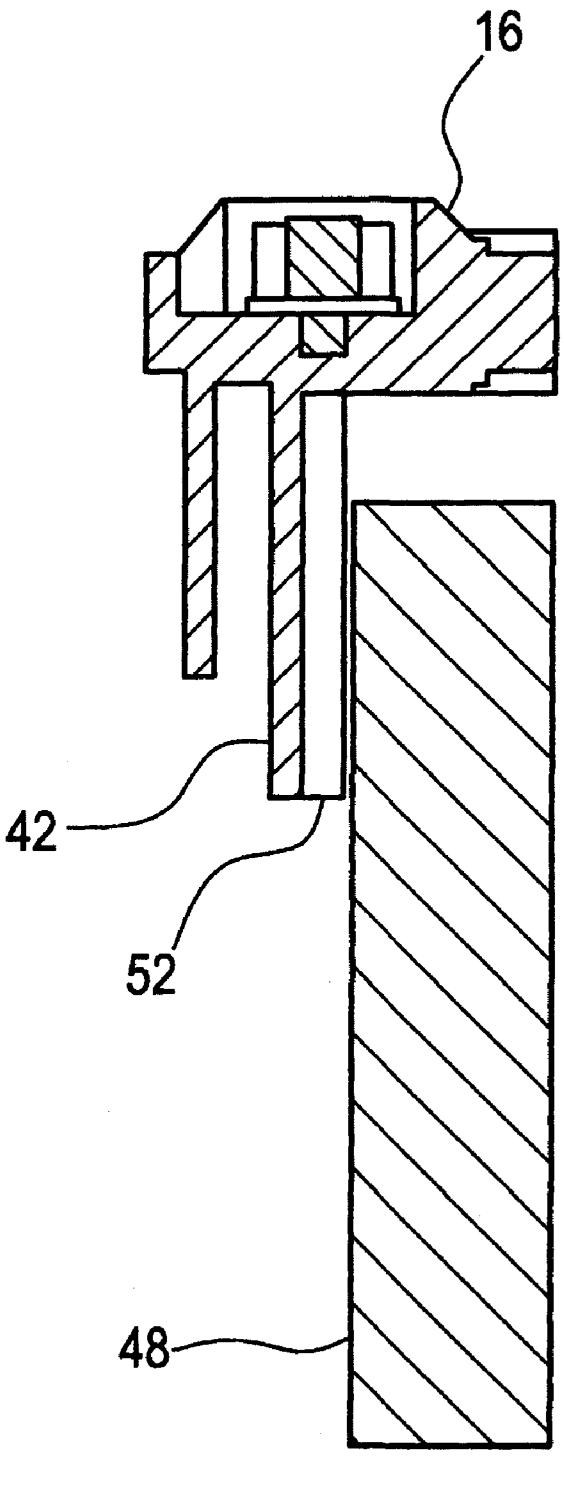
FIG. 6 is a cross-sectional view taken along line A-A in FIG. 4.
Figure 7:
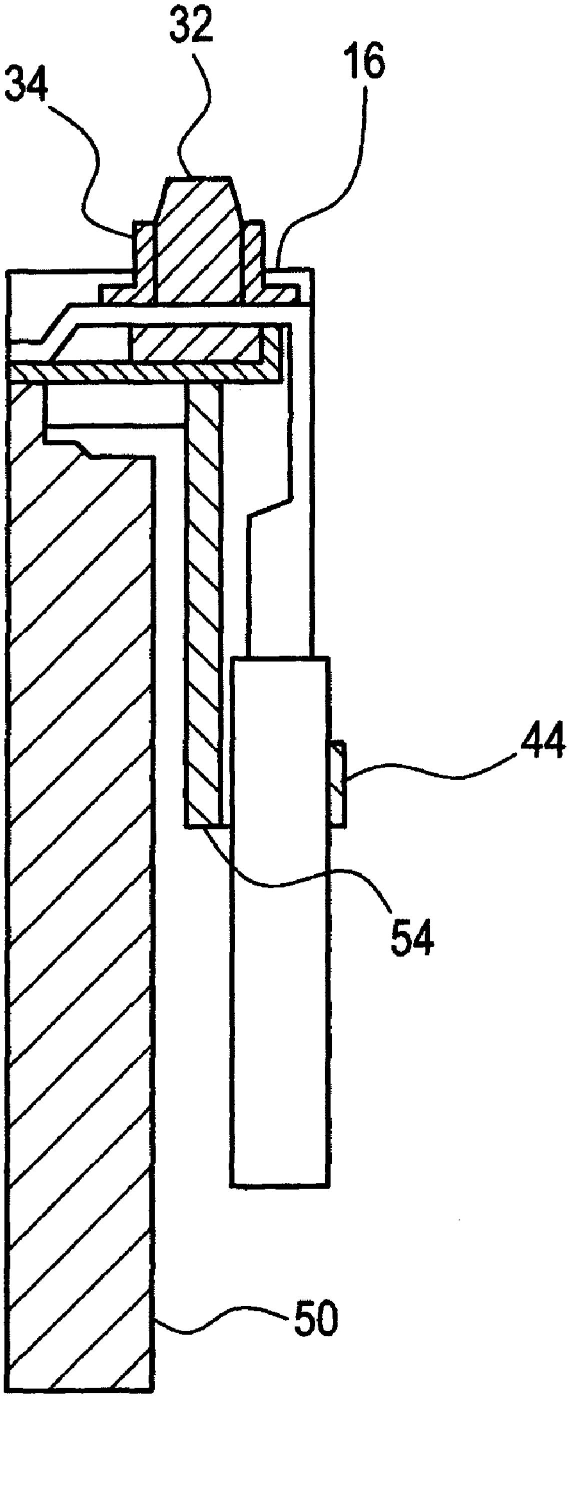
FIG. 7 is a cross-sectional view taken along line B-B in FIG. 4.
Figure 8:
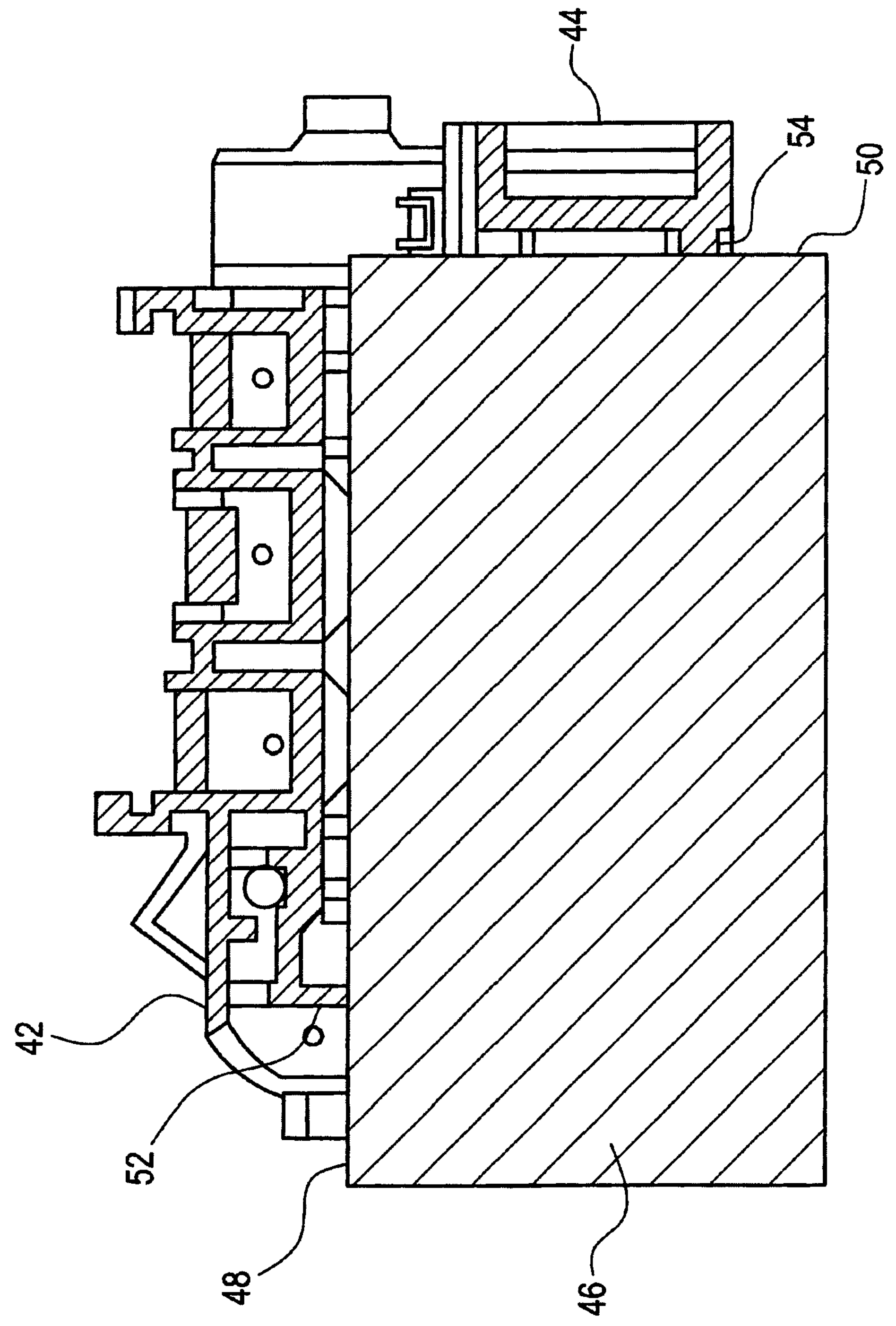
FIG. 8 is a cross-sectional view taken along line C-C in FIG. 5.

FIG. 6 is a cross-sectional view taken along line A-A in FIG. 4. FIG. 7 is a cross-sectional view taken along line B-B in FIG. 4. FIG. 8 is a cross-sectional view taken along line C-C in FIG. 5. As shown in these drawings, the ribs 52 and 54 which are provided on the respective sides 42 and 44 of the L-shaped housing 16 are adapted to abut against the two side surfaces 48 and 50 making up a corner portion of the battery 46.

Figure 9:
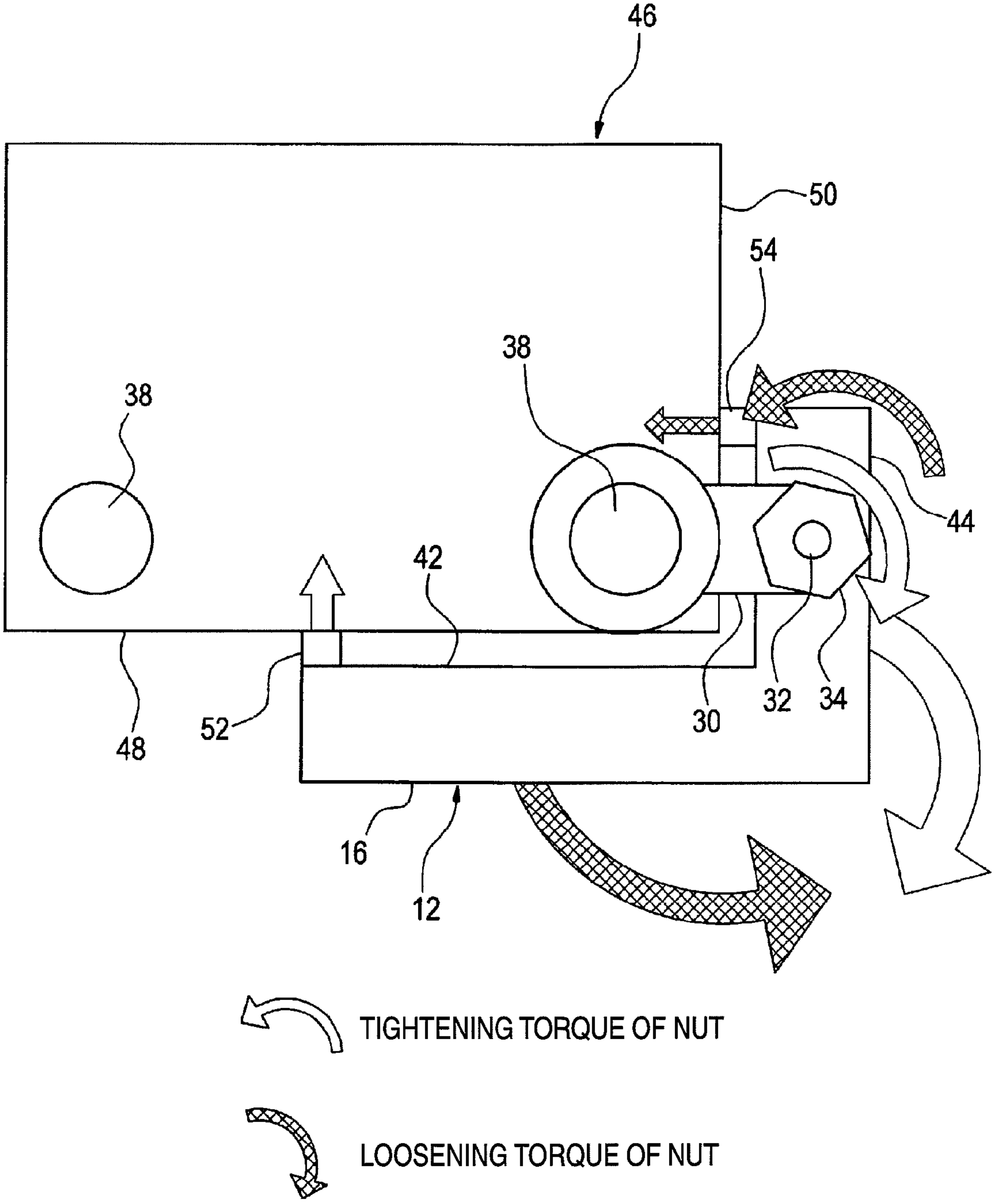
FIG. 9 is a schematic diagram of a state in which the fusible link unit is mounted on a battery.

As shown in FIG. 9, which is a schematic diagram of a state in which the main body 12 is installed on the battery 46, the respective sides 42 and 44 of the L-shape of the housing 16 oppose the two side surfaces 48 and 50 forming a corner portion of the battery 46, and the main body 12 is mounted on the battery post 38 by means of the battery terminal 30 in a state in which the ribs 52 and 54 can abut against the respective side surfaces 48 and 50 of the battery 46. Accordingly, when the main body 12 is tightened to the battery terminal 30 by the nut 34, and when the terminal 26 of the wire harness 24 which is connected to the stud bolt 22 of the main body 12 is tightened by the nut 28, the torque applied to the battery terminal 30 can be dispersed to the two side surfaces 48 and 50 of the battery 46 through the ribs 52 and 54 of the main body 12.

Then, since the side surfaces 48 and 50 against which the ribs 52 and 54 abut receive rotational moment, the main body 12 is prevented from being rotated together with the rotation of the nut 34. Accordingly, excessive load is not applied to the main body 12 and the battery terminal 30, so that these parts do not become damaged and therefore excel in durability.

Figure 10:
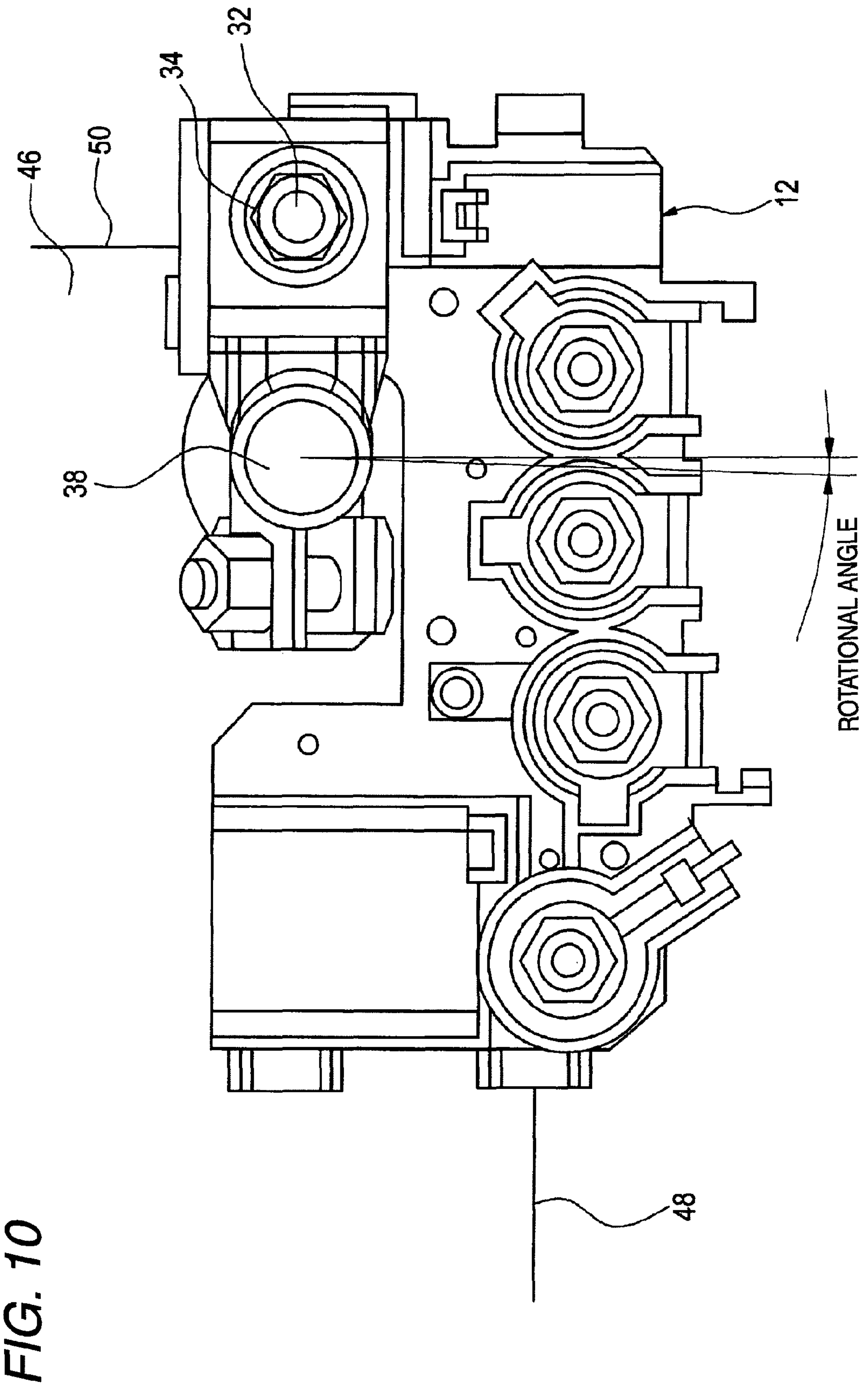
FIG. 10 is a schematic diagram illustrating a state of clockwise rotation of the fusible link unit.
Figure 11:
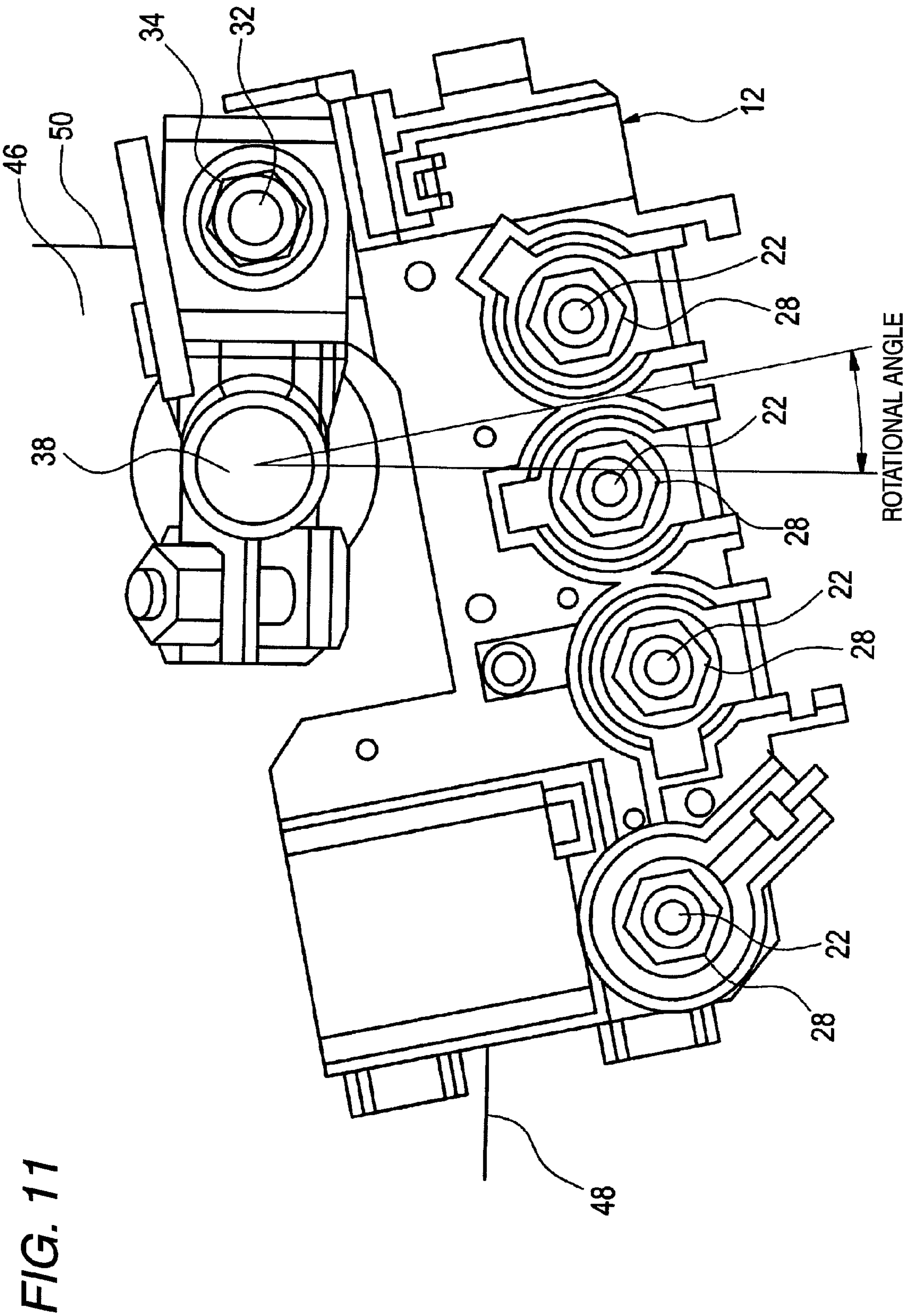
FIG. 11 is a schematic diagram illustrating a state of counterclockwise rotation of the fusible link unit.

It should be noted that the ribs 52 and 54 are not always in abutment against the side walls 48 and 50, normally have slight gaps with respect to the side walls 48 and 50, and abut against the side walls 48 and 50 when the rotational moment has been applied to the housing 16. Thus, in a case where a clockwise rotational moment has been applied by tightening the nut 34, as shown in FIG. 9, the housing 16 rotates clockwise by a very small angle, as shown in FIG. 10. On the other hand, in a case where a counterclockwise rotational moment has been applied by loosening the nut 34, as shown in FIG. 9, the housing 16 rotates counterclockwise by a very small angle greater than that of the clockwise rotation, as shown in FIG.

11. However, since the housing 16 rotates only by a very small degree, an excessive load is not imparted to the battery terminal 30 and the like.

In addition, instead of the above-described arrangement, I the ribs 52 and 54 are respectively brought into close contact with the side walls 48 and 50 without providing the very small gaps therebetween, and the main body 12 is supported by being pressed against the battery 46, the installing direction of the main body 12 with respect to the battery 46 can be maintained in a fixed state. Further, after the installation to the battery 46, even if the fusible link unit 10 undergoes vibrations in directions in which the ribs 52 and 54 are supported onto the side surfaces 48 and 50 of the battery 46, the ribs 52 and 54 limit the vibrations and make it possible to alleviate an excessive concentration from being concentrated on the battery terminal 30.

In addition, since the arrangement provided is such that the ribs 52 and 54 constituted by elongated protrusions abut against the side walls 48 and 50, a fixed interval is formed between the battery 46 and the main body 12. As a result, even if the battery side surfaces 48 and 50 have irregular surface configurations, the ribs 52 and 54 are able to reliably abut against the side surfaces 48 and 50, so that the heat radiation effect of the fusible link unit 10 during its energization and heat generation is not impaired.

Figure 12A:
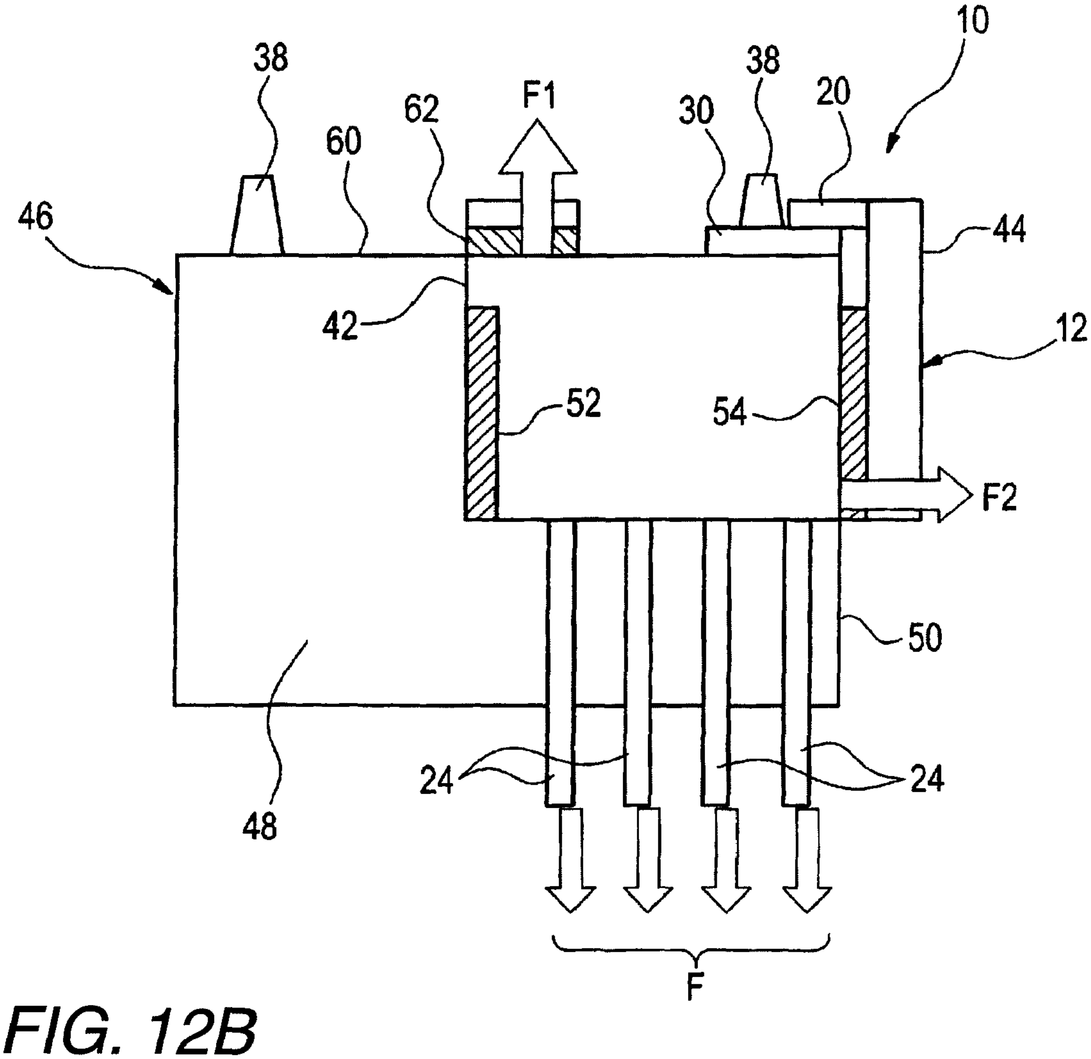
Figure 12B:
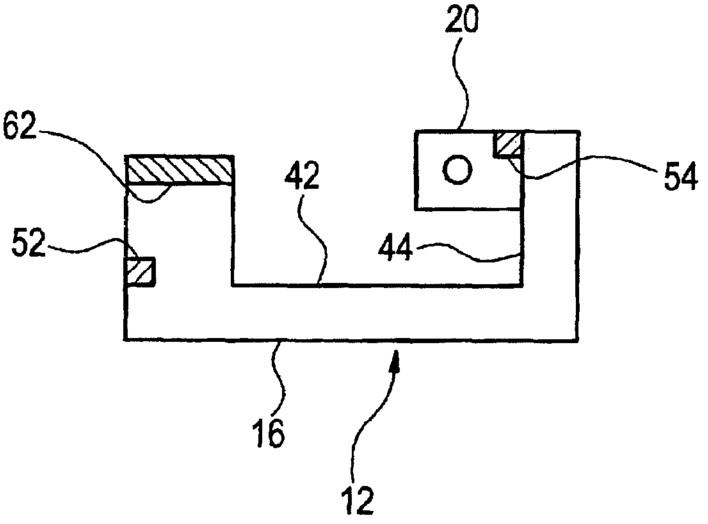
Figure 13:
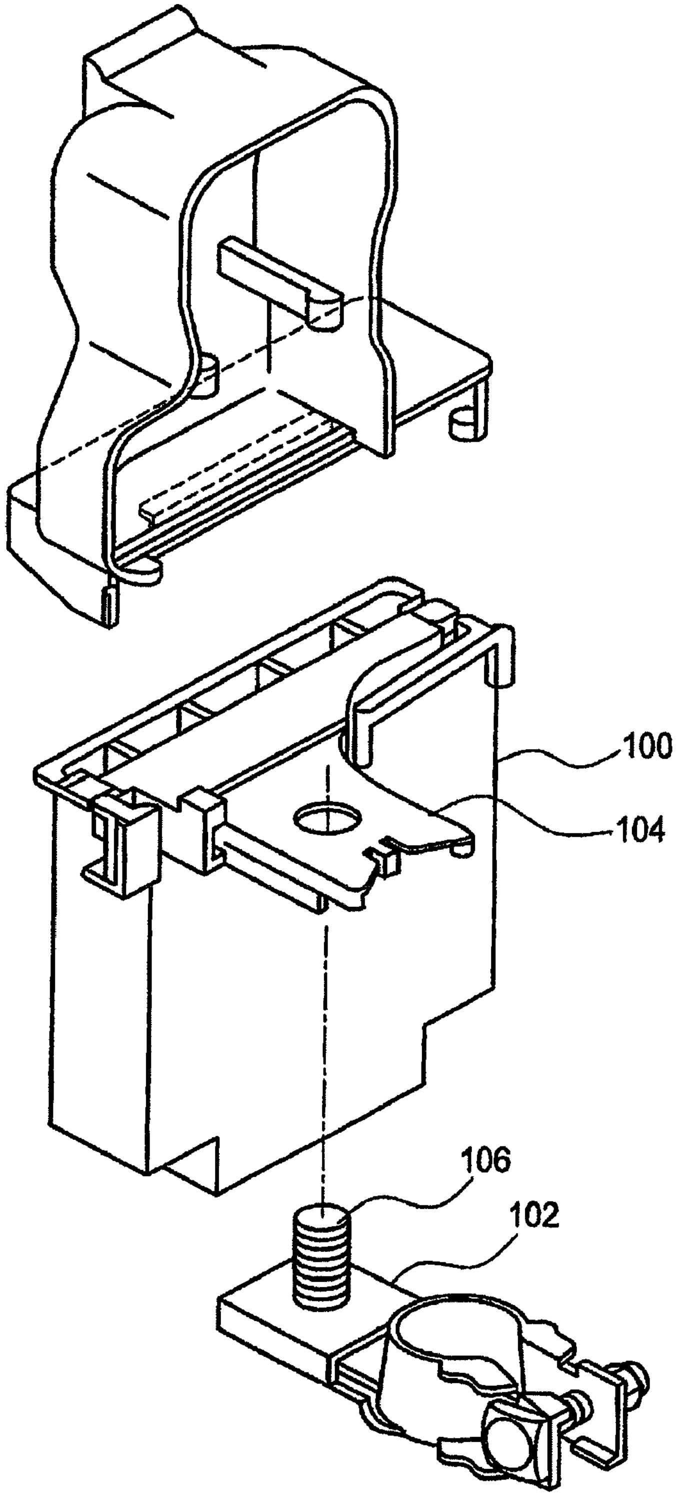
PRIOR ART FIG. 13
FIG. 13 is an exploded perspective view of a structure for assembling a fuse box in patent document 1.
Figure 14:
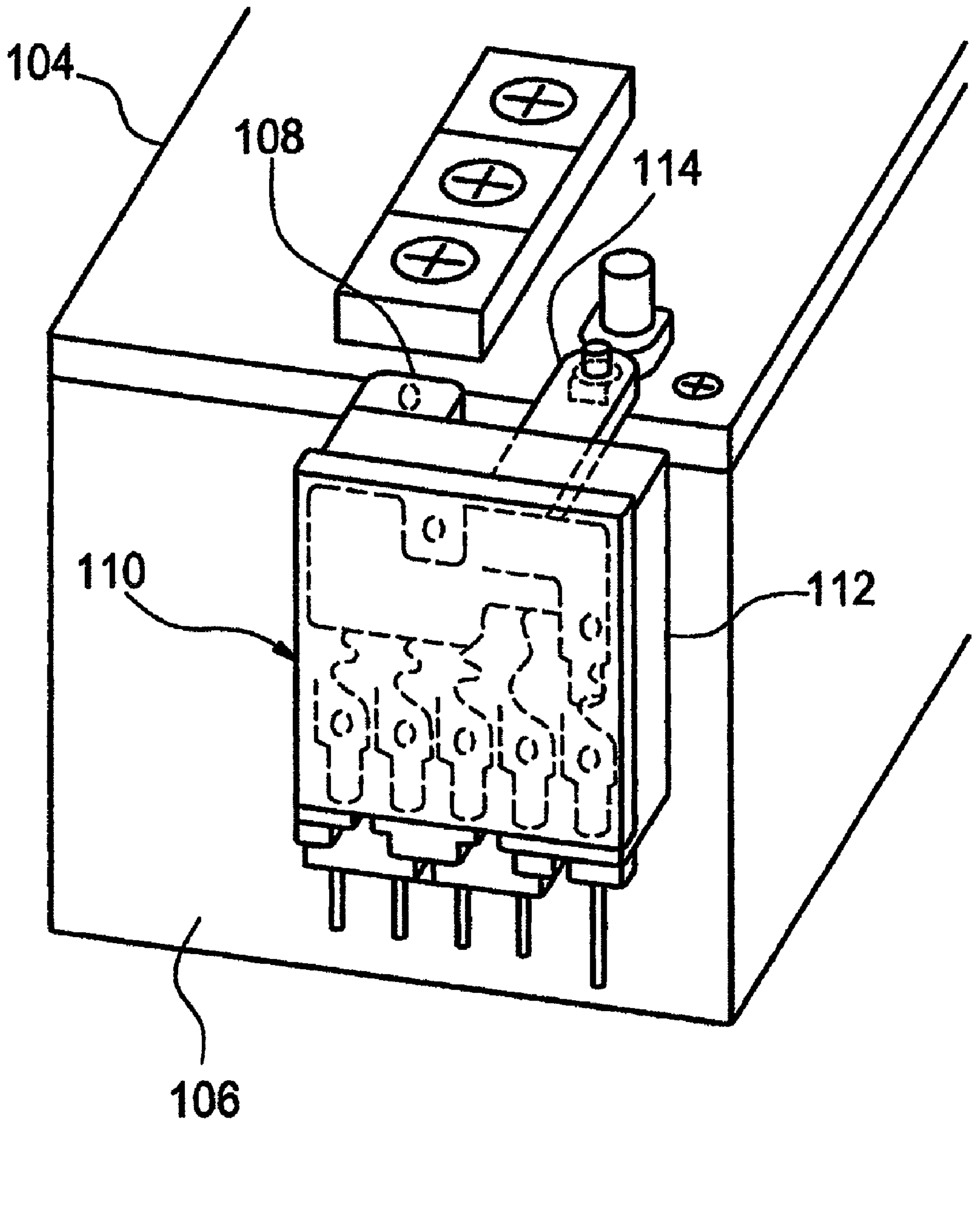
PRIOR ART FIG. 14
FIG. 14 is a perspective view of essential portions of another structure for assembling a fuse box in patent document 2.
Figure 15:
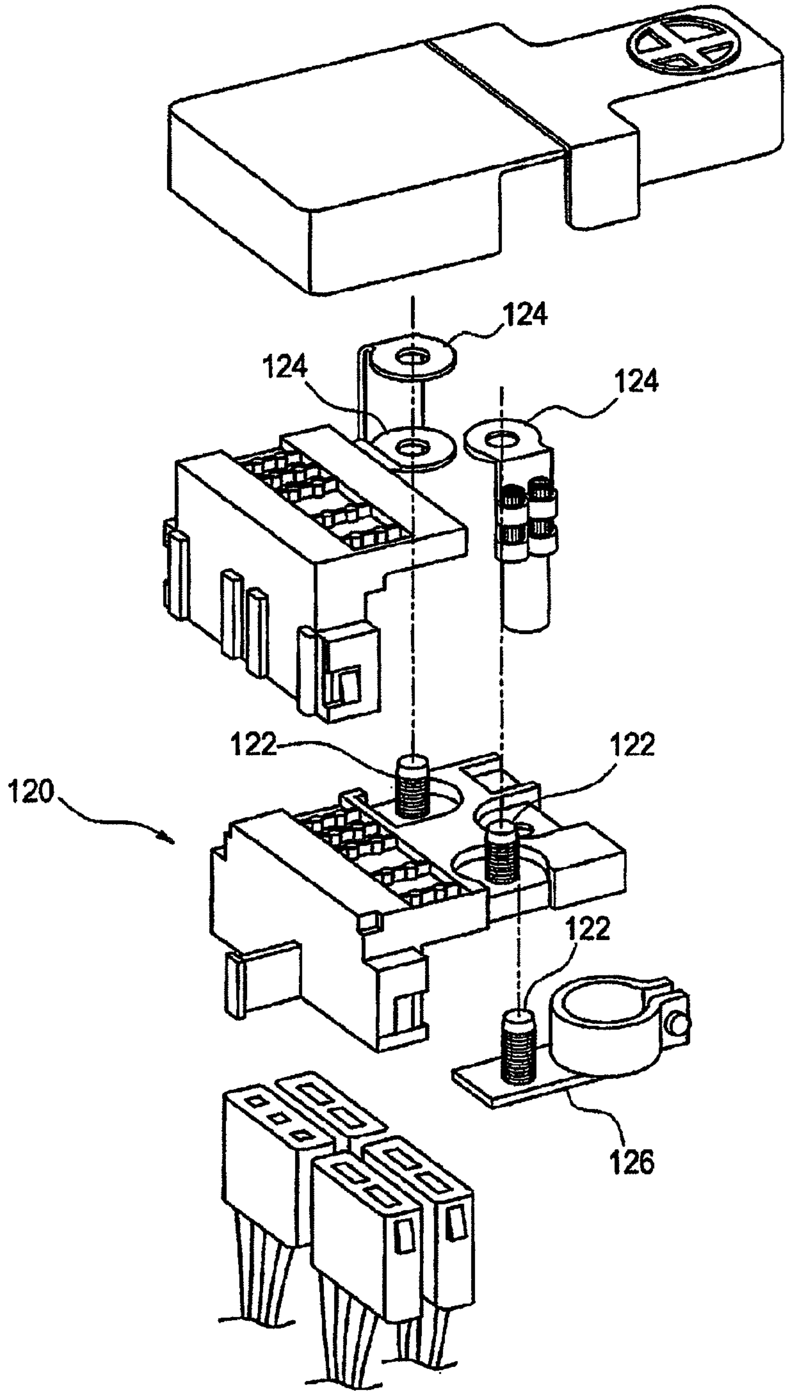
PRIOR ART FIG. 15
FIG. 15 is an exploded perspective view of still another structure for assembling a fuse box in patent document 3.
Figure 16:
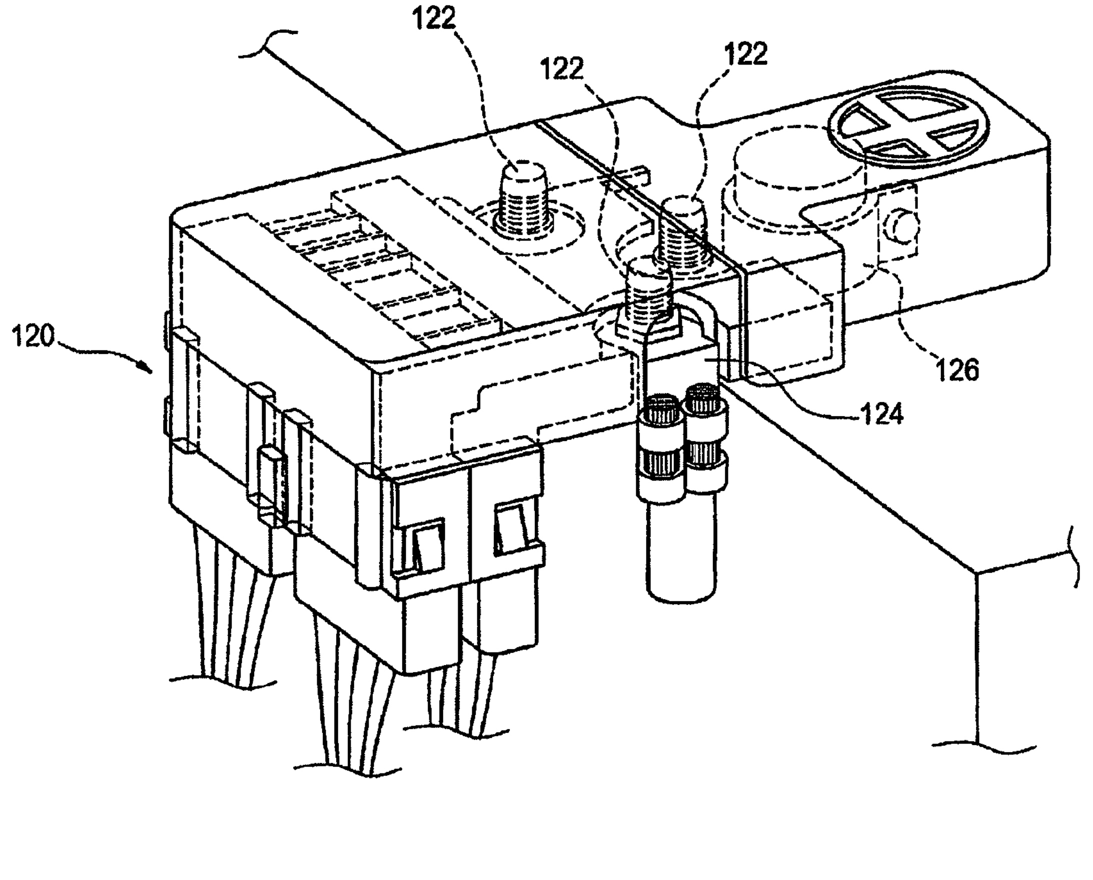
PRIOR ART FIG. 16
FIG. 16 is a perspective view of essential portions of the structure for assembling a fuse box in the patent document 3.

FIGS. 12A and 12B show schematic diagrams of a modification of the fusible link unit 10, in which FIG. 12A is a side elevational view of a state in which the fusible link unit 10 is assembled to the battery 46, and FIG. 12B is a plan view of the main body. It should be noted that, in FIG. 12A, reference character F denotes the self weight or tension of the wire harness 24, and F1 and F2 denote reaction forces at abutment portions.

As shown in FIGS. 12A and 12B, a supporting piece 62 abutting against an upper surface 60 of the battery 46 is provided on the side 42 of the housing 16 on the side where the connecting end portion 20 of the bus bar 14 of the main body 12 is not extendingly provided, whereby the self weight or tension F of the wire harness 24 connected to the main body 12 can be supported by the upper surface 60 of the battery 46. As a result, it is possible to alleviate the downward stress of the wire harness 24 from becoming concentrated in the battery terminal 30, and in the event that vertical vibrations have been applied to the battery 46, it is possible to restrict the fusible link unit 10 from rocking vertically and alleviate a stress from being applied to the connecting portion of the battery terminal 30.

It should be noted that the invention is not limited to the above-described embodiment, and various modifications are possible based on the technological concept of the invention. For example, the ribs 52 and 54 may not be in the form of elongated protrusions, and may be mere projections. In addition, the number of the ribs 52 and 54 may be arbitrary and is not particularly limited.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2007-283073 filed on Oct. 31, 2007, the contents of which are incorporated herein for reference.

What is claimed is:

1. A fusible link unit, comprising:

a battery terminal that is connected to a battery post which extends from a first side surface of a battery; and a fusible link main body having a base portion and a bus bar insert molded in the base portion and electrically connected to the battery terminal, wherein the base portion has an L-shape having a first face and a second face disposed orthogonal to each other;

wherein the fusible link main body includes a main stud bolt for connection to the battery terminal and at least one auxiliary stud bolt for connection to a wire harness and a fuse portion provided on the bus bar which is electrically connected between the main stud bolt and the auxiliary stud bolt;

wherein said first and second faces respectively include abutment portions which respectively abut against second and third side surfaces of the battery that are orthogonal to each other and to the first side surface during the connection or disconnection of the battery terminal to the main stud bolt or the wire harness to the auxiliary stud bolt; and wherein the abutment portions are protruding portions which are provided so as to respectively project toward the second and third side surfaces of the battery.

2. The fusible link unit according to claim 1, wherein the bus bar includes a connection end portion which extends from the first face of the base portion and contacts the battery terminal;

wherein a supporting portion which abuts against the first side surface of the battery is extended from the second face of the base portion; and wherein the first side surface is an upper surface of the battery.

3. The fusible link unit according to claim 2, wherein the supporting portion is a protruding portion which is provided so as to project toward the upper surface of the battery.

4. The fusible link unit according to claim 1, wherein the wire harness is connected to an electrical equipment circuit.

5. The fusible link unit according to claim 1, wherein the abutment portions are projected in first and second directions which are respectively perpendicular to an extending direction of the battery post.

* * * * *